United States Patent [19]
Ketcham et al.

[11] Patent Number: 5,089,455
[45] Date of Patent: Feb. 18, 1992

[54] THIN FLEXIBLE SINTERED STRUCTURES

[75] Inventors: Thomas D. Ketcham, Big Flats; Wayne B. Sanderson, deceased, Corning, by Stuart R. Sanderson, administrator; Dell J. St. Julien, Watkins Glen; Kathleen A. Wexell, Corning, all of N.Y.

[73] Assignee: Corning Incorporated, Corning, N.Y.

[21] Appl. No.: 473,343

[22] Filed: Feb. 1, 1990

Related U.S. Application Data

[63] Continuation-in-part of Ser. No. 393,532, Aug. 11, 1989, abandoned.

[51] Int. Cl.$^5$ .............................................. C04B 35/64
[52] U.S. Cl. .................................. 501/104; 501/105; 264/63
[58] Field of Search .............. 501/102, 104, 105, 108; 264/63

[56] References Cited

U.S. PATENT DOCUMENTS

| | | | |
|---|---|---|---|
| 3,988,405 | 10/1976 | Smith et al. | 264/63 |
| 4,678,762 | 7/1987 | Agarwal et al. | 501/127 |
| 4,710,227 | 12/1987 | Harley et al. | 106/193 R |
| 4,966,742 | 10/1990 | Khoury et al. | 264/166 |

FOREIGN PATENT DOCUMENTS 304061 2/1989 European Pat. Off. .

OTHER PUBLICATIONS

I. S. Reed, "Introduction to Principles of Ceramic Processing", 1988, John Wiley and Sons, pp. 395–399.

Primary Examiner—William R. Dixon, Jr.
Assistant Examiner—Chris Gallo
Attorney, Agent, or Firm—Kees van der Sterre; Clinton S. Janes

[57] ABSTRACT

Thin inorganic sintered structures having strength and flexibility sufficient to permit bending without breakage in at least one direction to a radius of curvature of less than 20 centimeters, methods for making them, and products incorporating them, are described. Preferred sintered ceramic structures according to the invention can comprise zirconias, titanias, aluminas, silicas, rare earth metal oxides, alkaline oxides, alkaline earth metal oxides and first, second, and third transition series metal oxides and combinations thereof and therebetween. Sintered metal structures can also be provided.

22 Claims, 1 Drawing Sheet

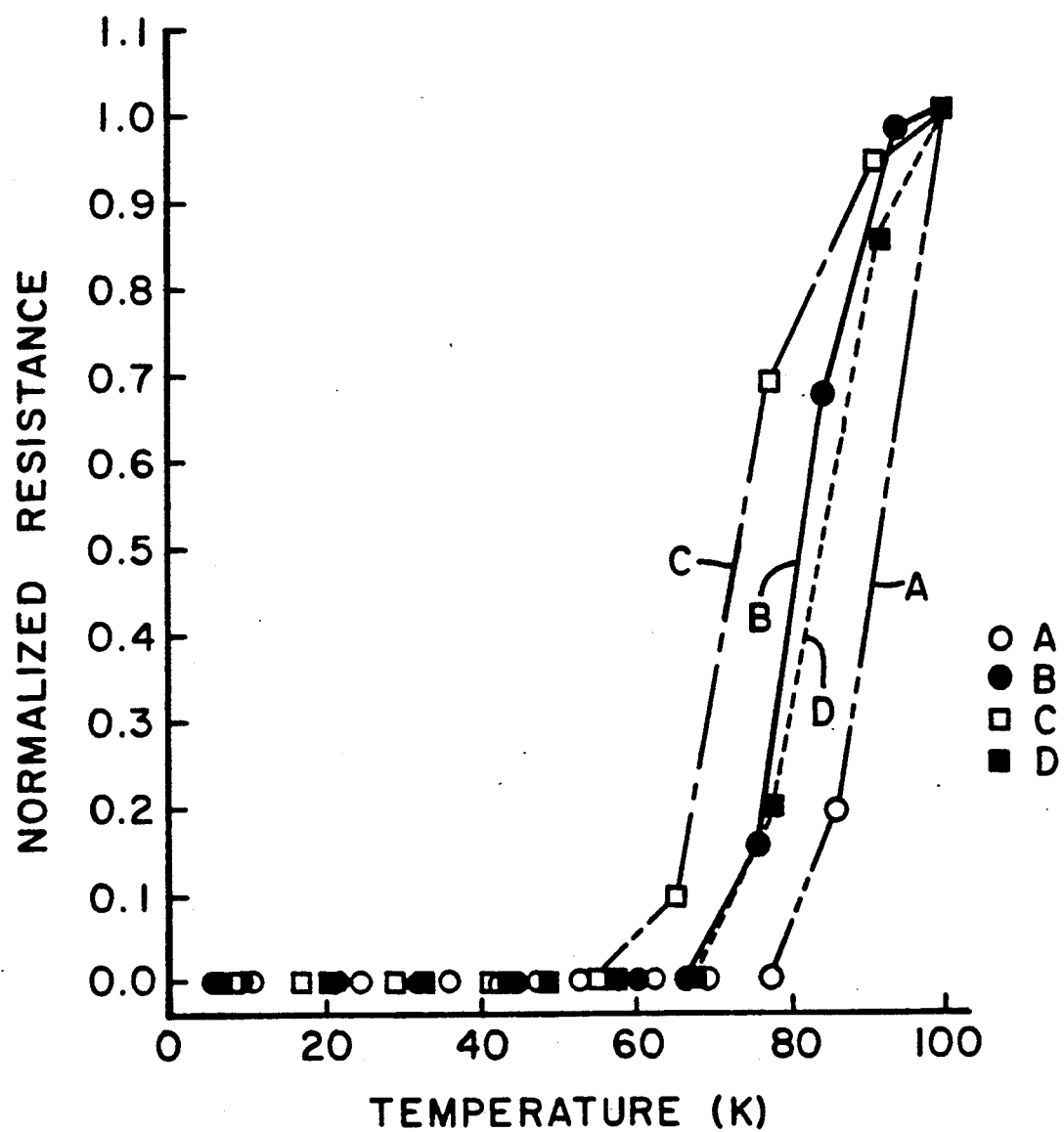

THIN FLEXIBLE SINTERED STRUCTURES

This application is a Continuation-In-Part application of Ser. No. 07/393,532, filed Aug. 11, 1989 abandoned.

BACKGROUND OF THE INVENTION

The present invention is directed toward flexible sintered structures. More specifically, the invention relates to flexible high strength inorganic structures such as inorganic sheets or tapes, made by combining powdered metallic, metalloid or, most preferably, oxide powders with appropriate liquid vehicle components and casting or otherwise shaping and sintering the resultant powder batches. Sheets, foils, ribbons, or other high aspect ratio products made in accordance with the invention can exhibit high hardness, flexibility, and toughness with excellent thermal stability over a wide range of temperatures.

Thin flexible sintered structures are useful for a multitude of productive applications. They may be employed for electronic and/or electrooptic uses, such as waveguides, or as substrates for electronic coatings, superconductors, or high temperature superconductors.

With improved mechanical properties, flexible ceramics could be useful as a protective layer for glass or other substrate materials where a layer of protection is needed to resist scratches. With sufficient structural flexibility in the flexible ceramic, the object to be protected could simply be wrapped for protection.

Flexible inorganics, especially flexible ceramics, would offer unique advantages as chemically stable substrate materials. Porous ceramic materials are known to provide high surface areas. High surface area substrates provide desirable receiving surfaces for a variety of coatings. Alumina, for example, provides in its many crystalline forms an excellent surface for the application of catalysts. Porous or dense alumina which could be provided as a flexible ceramic foil and subsequently coated with a base or noble metal and/or oxide catalyst, or treated with zeolites, would have unique advantages for a variety of chemical applications.

Sintered porous metallic foils, e.g., porous stainless steel foils, can be made and optionally oxidized or otherwise treated to provide high surface area metal-based substrates. Coated substrates of metallic or oxide type, formed into any desired honeycomb or other circular, laminar, and/or trapezoidal structures, would offer stable support in harsh environments where flexibility in combination with a specific substrate geometry would be particularly advantageous.

Since the discovery of high temperature oxide superconductors, there has been widespread interest in combining these relatively brittle materials with strong flexible substrate materials to provide superconducting wires. Those skilled in the superconductor art have struggled to identify useful substrates for these superconductors.

One suggestion has been to use metallic components to provide supporting substrates or jacketing for the superconductors. A particular disadvantage of metals, however, is the diffusivity of the metals at the sintering temperatures required for ceramic superconductor application, which could undesirably modify the compositions of the applied superconductor materials.

Unlike metals, ceramic substrates are conventionally sintered at a higher temperatures than any of the yttrium barium copper oxide (YBCO), bismuth strontium copper oxide (BSCO) and/or thallium copper oxide families of high temperature superconductors, thus minimizing the diffusivity problem. Additionally, ceramics are more compatible with oxide superconductor coatings, due perhaps to improved wetting of the substrates by the coatings during coating application. Thus decreased interfacial discontinuities and increased substrate/layer stability are attainable. As those skilled in this art can appreciate, other metal and/or oxide and/or ceramic coatings would also benefit from this improved coating compatibility.

Of course the production of thin and flexible ceramic fibers such as silicon carbide fibers and aluminosilicate fibers is well known. Ceramic fibers of these types are generally produced by spinning techniques or variations thereof. For example, Nicalon ® (silicon oxycarbide) fibers, Nextel ® ($Al_2O_3$—$SiO_2$—$B_2O_3$) fibers, and even Γ-alumina fibers are typically produced by spinning a fiber of a pyrolyzable precursor material and then pyrolyzing the spun fiber. Alternatively, fibers of alumina and zirconia can be produced by spinning a precursor material comprising fine oxide powder, followed by sintering to an integral oxide fiber product.

Still other methods of fiber manufacture include the vapor deposition of precursors onto a starting or substrate filament and/or the spinning and optional heat treatment of glass fibers from molten glass. Although none of the fibers produced from precursors as above described are perfectly cylindrical, almost all are of very low aspect ratio, i.e., below 2:1. For a further discussion of the major fibers and their use in composites, reference may be made to Frank K. Ko, "Preform Fiber Architecture for Ceramic-Matrix Composites," Am. Ceram. Soc. Bull., 68 [2] 401–414 (1989).

Unfortunately, while formed of inherently strong materials, long fibers of these ceramic materials are very weak. The weakness of fibers is simply due to the flaw populations in the fibers and the statistical laws which insure that most long fibers will include at least one defect of sufficient magnitude to cause failure at stress levels well below the inherent strength of the material.

While the strength levels attainable depend of course on the number and size of the defects introduced into the fibers from batch or manufacturing process sources, the defect population needed to sustain successful production of strong long fibers is very small. Thus, for example, it can be calculated that, for fibers of 10 microns diameter comprising defect particles or voids of similar size, defect levels below 1 defect per each one hundred million parts of volume are needed to yield reasonable selections of strong kilometer-long lengths of fiber.

Prior work in the field of thin film ceramics includes U.S. Pat. No. 4,710,227 disclosing the preparation of thin flexible "green" (unfired) ceramic tapes from solutions, the tapes being coated and cut, stacked and fired to form thin-dielectric capacitors. This process is further described in published European applications EP 0302972 and EP 0317676. Capacitors with ceramic layers of 1–50 microns can be made; however the capacitor fabrication process which is disclosed does not utilize the production or handling of sintered or fired (binder-free) flexible tapes in unstacked or unsupported form. In addition, the range of useful materials is limited by the ceramic process employed.

SUMMARY OF THE INVENTION

The present invention solves many of the problems associated with prior applications and methodologies of flexible sintered structures. The present invention provides a thin flexible sintered structure for a wide field of uses, herebefore deprived of a suitable sintered structural flexible material.

The product of this invention is useful in any environment where a hard tough thin refractory flexible substrate and/or layer is needed. The flexibility will depend on layer thickness to a large measure and therefore can be tailored as such, for a specific use. Generally, the thicker the substrate the less flexible it becomes. Thinner substrates can be flexible to the point where toughened and hardened sintered materials may waff in a slight breeze, yet remain hard and tough to mechanical and/or thermal abuses. A use of this kind of strong flexibility could be as a diaphragm in a pump or valve.

High surface areas can be created by manipulating porosity. Porosities are increased by manipulating sintering temperatures and/or including higher loadings of materials within the batch that burn out at firing temperatures. Porosities of the present invention can be as low as zero or as high as about 60%. Both porous and dense foils will maintain flexibility, due to the slight thickness of the product. Differential porosities in these materials can be useful for filtration and/or membrane operations.

The chemical inertness as well as the surface morphology, thermal expansion, and flexibility of the present flexible inorganic substrates make them promising substrates for superconductor materials.

This invention thus provides a means for applying ceramic process technology to a wide variety of materials for the production of flexible inorganic, preferably ceramic, products. Thin materials can be formed in the green state in a molded configuration and subsequently sintered to a dense or porous structure with a large measure of flexibility.

In the method of the present invention a thin preform, for example a thin sheet or layer comprising the green material, is first produced. The material is then sintered to provide a thin sintered structure with a flexibility sufficient to permit a high degree of bending without breakage under an applied force. Flexibility in the sintered material is sufficient to permit bending to an effective radius of curvature of less than 20 centimeters or some equivalent measure, preferably less than 5 centimeters or some equivalent measure, more preferably less than 1 centimeter or some equivalent measure, and most preferably less than 0.5 centimeter or some equivalent measure.

By an "effective" radius of curvature is meant that radius of curvature which may be locally generated by bending in a sintered body in addition to any natural or inherent curvature provided in the sintered configuration of the material. Thus the curved sintered ceramic products of the invention are characterized in that they can be further bent, straightened, or bent to reverse curvature without breakage.

The cross-sectional thickness of the sintered structure on axes parallel to axes of applied force easily relieved by bending of the structure preferably will not exceed about 45 microns, and most preferably will not exceed about 30 microns. The lower limit of thickness is simply the minimum thickness required to render the structure amenable to handling without breakage. Sintered thicknesses of 4 microns can readily be achieved, and thicknesses on the order of 1 micron appear quite feasible.

For thin sheet or tape structures, depending on the composition of the material, a single layer or a plurality of layers up to 500 $\mu$m in thickness can in some cases be made or assembled while still retaining some flexibility. However, for the desired low bending radius, sintered sheet or segment thicknesses will most preferably not exceed 30 $\mu$m, or even 10 $\mu$m, with thicker members being provided by layering the thin sintered sheets or other segments.

DESCRIPTION OF THE DRAWING

The drawing is a plot of electrical resistivity versus temperature for a superconducting oxide coating disposed on a flexible ceramic substrate in accordance with the invention.

DETAILED DESCRIPTION

Generally, the green material used in the invention is comprised of zirconias, aluminas, titanias, silicas (including zirconates, aluminates, titanates and silicates), rare earth metals and/or their oxides, alkalis and alkaline earth metals, and/or their oxides, steels, stainless steels, aluminides, intermetallics, aluminum and its alloys, the first, second, and third transition series of metals, their oxides, borides, nitrides, carbides, silicides, and/or combinations thereof and therebetween. Optional additions of sintering aids, dispersants, binders, plasticizers, toughening and hardening agents, and solvents can be advantageously present. The materials of interest especially include brittle materials. It is a particular advantage of the invention that structural flexibility can be achieved in sintered structures composed of materials which are normally considered to be brittle and inflexible.

Utilizing extrusion, tape casting or other known ceramic batch shaping technology, a selected combination of the above components is mixed into a plastic batch, formed into an elongated green body of any desired cross-sectional shape, and sintered. While the preferred cross-sectional shape of the sintered structure is linear (as for thin sheet or tape), other shapes including rectangular, cylindrical (tubular), trapezoidal, I-shapes, H-shapes, or dumbbell shapes may be provided. In each case, however, the cross-sectional shape is characterized by at least one high-aspect-ratio segment, such as a straight or curved web or connecting segment or an extending fin or other protruding segment, which is sufficiently thin to be flexible in sintered form. By a high-aspect-ratio segment is meant a segment having an aspect ratio (segment length to thickness) of at least 2:1, more preferably at least 3:1.

For the manufacture of the preferred green sheet or tape, a slurry or slip is preferably made from the green batch by the addition of sufficient solvent to obtain a fluid viscosity. The slurry or slip is then formed into a uniform thin sheet by a thin sheet forming means, for example doctor blading, rolling, mashing, extrusion or any means those skilled in the art use to make thin sheets or foils. The thin sheet is then heated to sintering temperatures. The resultant structure is a sintered strong material with multi-directional flexibility.

Preferred ceramic compositions suitable for flexible substrate production in accordance with the invention include zirconia-based compositions. As is known, zirconia-based ceramic materials may optionally include the oxides of the transition series metals and the rare earth metal oxides. Stabilized zirconias, such as those stabilized by additions of alkaline earth metal oxides including for example magnesia and/or calcia, titanium and tin oxides, are preferred embodiments. Those compositions stabilized with yttria, are more preferred embodiments.

Some other useful examples of stabilizers are those selected from indium oxide and the oxides of the rare earth metals such as lanthanum, cerium, scandium, praseodynium, neodynium, samarium, europium, gadolinium, terbium, dysprosium, holmium, erbium, thulium, ytterbium, and lutetium. The crystalline geometries of zirconia such as tetragonal, monoclinic, and/or cubic and their combinations are all important physical parameters of this structural material.

Ceramic sheets or so-called ceramic foils can be made tougher by selecting certain toughening agents known to those skilled in this art. Particularly useful and preferred toughening agents are the oxides of tantalum and niobium which can be advantageously added to the above stabilizers. Reference to these toughening materials is made in published European patent application EP 0199459, published Oct. 29, 1986, the substance of which is herein incorporated by reference in its entirety.

That patent also discloses the properties of useful bulk materials such as $\alpha$-alumina, $\beta$-alumina, $\beta''$-alumina, $Al_2O_3$—$Cr_2O_3$ solid solution, mullite, and spinel. These same materials can be usefully employed as ceramic body components and/or as companions to zirconia and the before-stated toughening agents.

Combinations of titania and zirconia consisting essentially of 45 to 94.75 mole percent zirconia, 5 to 45 mole percent titania, and 0.25 to 10 mole percent rare earth metal oxides are found to be advantageous compositions for forming flexible substrates in accordance with the invention. Toughness and hardness properties are disclosed in U.S. Pat. No. 4,753,902, the disclosure of which is incorporated herein by reference in its entirety.

Combinations of molybdenum and tungsten oxides with magnesia, calcia, zirconia and rare earth metal oxides have also been found to provide useful ceramic materials. For instance, zirconia/hafnia-based compositions consisting essentially of about 79-99.5 mole percent of oxide components selected from the group consisting of $ZrO_2$, $HfO_2$, partially stabilized $ZrO_2$, partially stabilized $HfO_2$, $ZrO_2$—$HfO_2$ solid solution, and partially stabilized $ZrO_2$—$HfO_2$ solid solution, together with 0.25 to 15 mole percent of the before stated rare earth metal oxides and 0.25 to 6 mole percent of the oxides of molybdenum and/or tungsten, are found to be useful compositions. Optional supplemental additions of 0.5-10 mole percent of rare earth vanadates are useful in these formulations.

The above zirconia/hafnia based compositions are disclosed in commonly assigned U.S. patent application Ser. No. 07/245,523, filed Sept. 19, 1988, the disclosure of which, as filed, is herein incorporated by reference as filed. Further materials therein described include compositions consisting essentially of about 40 to 94.75 mole percent of the above zirconia/hafnia oxide components, 5 to 45 mole percent of $SnO_2$, and 0.25 to 15 mole percent of rare earth metal oxides, these providing particularly hard and tough ceramic materials.

Also useful to provide flexible ceramics are compositions consisting essentially of about of 82 to 99 mole percent of one or more of oxides selected from the group consisting of $ZrO_2$, $HfO_2$, and $ZrO_2$—$HfO_2$ solid solutions, 0.5 to 10 mole percent of a stabilizer selected from the group yttria, scandia, rare earth metal oxides, ceria, titania, tin oxide, calcia, and magnesia, and 0.5-8 mole percent of toughening agents selected from the group consisting of yttrium and rare earth metal niobates, tantalates, and vanadates, and magnesium and calcium tungstates and molybdenates. These ceramics, characterizable as hard and tough ceramics exhibiting psuedo-plasticity, are disclosed in commonly assigned U.S. patent application Ser. No. 328,532 filed Mar. 24, 1989.

The invention also comprises thin flexible sintered ceramic structures as above described composed of certain recently developed hard refractory ceramic alloys. The ceramic alloys consist essentially of a novel zirconia alloy alone or in combination with a conventional refractory ceramic, the zirconia alloy (which those skilled in the art will recognize from the following description may equivalently be termed zirconia/hafnia alloy), constituting at least 5% and up to 100% by volume of the ceramic alloy.

The conventional refractory ceramics for these alloys are selected from known materials. Typically, one or more ceramics selected from the group consisting of $\alpha$-alumina, $\beta$-alumina, $\beta''$-alumina, alumina-chromia solid solutions, chromia, mullite, aluminum mullite-chromium mullite solid solutions, chromium mullite, sialon, nasicon, silicon carbide, silicon nitride, spinels, titanium carbide, titanium nitride, titanium diboride, zircon and/or zirconium carbide are used.

The novel zirconia/hafnia alloy, present alone or in a proportion of at least 5 volume percent as a toughening addition to the conventional refractory ceramic, will consist essentially of about: 35-99.75 mole % of oxides selected from the group consisting of zirconia, hafnia, and zirconia-hafnia solid solution and 0.25-45 mole % of one or more oxide additives selected in the indicated proportions from the following groups of additives. The first group consists of 5-45 mole % of titania and/or tin oxide. The second consists of 0-20 mole % total of metal oxides selected in the indicated proportions from the groups consisting of (i) 0-4 mole % of $MoO_3$ and/or $WO_3$, (ii) 0-10 mole % total of oxide compounds of the formula $MM'O_{4+/-\delta}$ wherein M' is V, Nb, Ta, or combinations thereof, M is Mg, Ca, Ti, Sn, Sc, Y, La, Ce, the rare earth metals, or combinations thereof, and $\delta$ is in the range of 0-1, and (iii) 0-6 mole % total of oxide compounds of the formula $M''M'''O_{4+/-\delta}$ wherein $M'''$ is W and/or Mo, M'' is Mg, Ca, Ti, Sn, Sc, Y, La, Ce, the rare earth metals, or combinations thereof, and $\delta$ is in the range 0-1.

In addition to one of the essential additives set forth above, the zirconia/hafnia alloy may comprise, as optional additives, 0-20 mole % of cerium oxide, and 0-10 mole % total of oxides of one or more metals selected from the group consisting of Mg, Ca, Sc, Y, La, and the rare earth metals.

In a more specific embodiment the zirconia/hafnia alloy consists essentially of 35-94.75 mole % of oxides selected from the group consisting of zirconia, hafnia, and zirconia-hafnia solid solution, 5-45 mole % of titania and/or tin oxide, and 0.25-20 mole % total of oxides selected in the indicated proportions from the group consisting of 0-20 mole % cerium oxide and 0-10 mole % total of oxides of metals selected from the group of Mg, Ca, Sc, Y, La, and the rare earth metals.

In yet another specific embodiment the zirconia/hafnia alloy consists essentially of 70-99.5 mole % of oxides selected from the group consisting of zirconia, hafnia, and zirconia-hafnia solid solution, 0.5-10 mole % total of oxide compounds of the formula $MM'O_{4+/-\delta}$ wherein M' is selected from the group of V, Nb, Ta, and combinations thereof, M is selected from the group of Mg, Ca, Ti, Sn, Sc, Y, La, the rare earth metals, and combinations thereof, and $\delta$ is in the range of 0-1. Optional additions to these alloys include 0-20 mole % cerium oxide and 0-10 mole % of oxides of metals selected from the group of Mg, Ca, Sc, Y, La, the rare earth metals, and combinations thereof.

In yet another specific embodiment the zirconia/hafnia alloy consists essentially of 79-99.75 mole % of oxides selected from the group consisting of zirconia, hafnia, and zirconia-hafnia solid solutions, 0-15 mole % total of compounds selected in the indicated proportions from the group consisting of 0-7 mole % of oxides of Mg, Ca, Sc, Y, La, and the rare earth metals and 0-15 mole % of $CeO_2$, $TiO_2$, and/or $SnO_2$. The alloys further comprise one or more toughening agents selected from the group consisting of 0.25-6 mole % total of compounds of the formula $M''M'''O_{4+/-\delta}$, wherein M''' is W and/or Mo, M'' is selected from the group consisting of Mg, Ca, Ti, Sn, Sc, Y, La, the rare earth metals and combinations thereof, and $\delta$ is in the range of 0-1, and 0.25-4 mole % of $MoO_3$ and/or $WO_3$.

As noted, in addition to providing alloying additives to harden conventional ceramics as set forth above, the zirconia alloys alone may constitute the hard ceramic alloy material used to make flexible ceramic substrates in accordance with the invention.

In the preferred method the invention takes compounds such as above described and produces thin flexible sintered sheets, foils, or ribbons therefrom. Of course, flexible whiskers and/or fibers may also be made from these materials, with good strength, but the very high strengths needed to provide strong, flexible ceramics providing dependable support properties in long lengths are not readily attainable in fiber and/or whisker configurations.

In order to manipulate these compositions into flexible structures, novel processing methods are required. Heretofore, similar compositions were used for cutting tool inserts as disclosed in U.S. Pat. No. 4,770,673, the disclosure of which is incorporated by reference. Due to their hardness and toughness after sintering, these compositions provided unlikely candidates for flexible ceramics. Nevertheless, it is now found that the following methodologies can successfully be used to embrace these materials and bodies within the family of thin sintered flexible materials.

To provide high quality thin sheet materials, fine powders of the component composition are needed. Preferred particle sizes are less than 5 $\mu$m in diameter, most preferably less than 1.5 $\mu$m in diameter. The powder can be milled and separated to obtain the preferred powder size.

To provide ceramic batches amenable to the appropriate forming techniques, the powdered batch materials are generally mixed with fugitive organic or inorganic vehicle formulations, most frequently formulations comprising one or more organic solvents. Examples of preferred organic solvents include mixtures of methanol and 2-methoxy ethanol. Other organic solvents that may be useful for this purpose are alcohols, ethers, aromatics, ketones, aldehydes, esters, alkanes, alkenes, alkynes, and or combinations thereof and therebetween. Inorganic solvents, particularly water, may additionally or alternatively be used as solvents.

Also useful in the preparation of ceramic batches in accordance with the invention are powder dispersants. A large number of dispersants can be utilized for this purpose, including, for example, phosphate esters, polyether alcohols, polymeric fatty esters, polyelectrolytes, sulfonated polyesters, fatty acids and their alkali and ammonium salts, and combinations thereof and therebetween. An example of a specific and preferred dispersant is Emphos PS-21A dispersant, a phosphate ester dispersant commercially available from the Witco Chemical Co., New York, N.Y.

Various plasticizers and binders known for use in the preparation of ceramic powder batches may also be included in the batch formulations of the invention. An example of a specific plasticizer which has been used is dibutyl phthalate, while a preferred binder is Butvar B-98 binder, a polyvinyl butyral binder commercially available from the Monsanto Company of St. Louis, Mo. Other binders that may be useful for this purpose include polyalkyl carbonates, acrylic polymers, alkyds, polyesters, cellulosic ethers, cellulosic esters, nitrocellulose, polyvinyl ethers, polyethylene glycol, polyvinyl butyral, polyvinyl alcohol, polyvinyl acetate, and silicones as well as copolymers, blends, or other combinations of the foregoing binder materials.

When mixing with metals care must be taken to avoid pyrophoricity. Additionally, when sintering the metal compositions, an inert and/or reducing atmosphere, or a vacuum is necessary to enable the metals to sinter without oxidation. Advantageously, after sintering, the metals can then be oxidized as disclosed in U.S. patent application Ser. No. 07/219,985 filed July 15, 1988 the disclosure of which is herein incorporated by reference as filed.

Once compounded and uniformly mixed, the batch is next formed into thin sheets or other preforms having thin flexible segments. This forming can be done by any means whereby a thin layer, sheet or web can be configured. Means such as doctor blading, pressing, rolling, extruding, printing, molding, casting, spraying, drawing, blowing, and combinations thereof and therebetween can provide green bodies incorporating thin segments or thin sheet configurations. Narrow ribbons or sheets many meters wide can be provided.

Two methods have been found which improve the strength, formability, and handleability of the green structures. In the first, the extrusion and/or drawing of low viscosity slips is combined with immediate and direct contact between the thin extrudate and a gelling and/or drying liquid. This technique has been found to be advantageous for imparting green strength to the extruded or otherwise configured green bodies. Binder, solvent, and gelling liquid combinations may be chosen so that one or more of the solvents in the ceramic slip is highly miscible with the gelling and/or drying medium. Preferably, the binder employed for batches to be thus treated is not be miscible with the gelling and/or drying medium, to avoid binder loss during drying or gelling.

Flocculation, gelation and/or drying are particularly useful for the extrusion of low-viscosity batch formulations. Slips with low initial viscosity can be extruded through fine orifices of complex shape into a gelling or drying liquid at relatively low extrusion pressures. With prompt gelling after extrusion, the extrudate gains strength and resists slumping and loss of shape definition. Thus shapes of complex configuration not otherwise extrudable, such as I-beam cross-sections or the like, can through rapid gelation be extruded with excellent shape retention in the green product.

Gelation can be facilitated by pKa or pKb (pKs) adjustments of the slip or through the use of combinations of extrudate treating media and slip vehicle combinations which promote rapid gelation of the extrudate. Examples of suitable media/vehicle combinations include the following:

| Batch Vehicle | Extrudate Treatment |
|---|---|
| polyvinyl butyral/alcohol | water |
| polybutyl methacrylate/isopropanol | methanol |
| polymethyl methacrylate/tetrahydrofuran | hexane |
| polymethyl methacrylate/toluene | hexane |

PKs adjustments can be effected by use of strong acids or bases and weak acids or bases, for example diethylamine. Weak acids such as propionic or acetic acid are preferred. The acid or base can be either organic or inorganic. A buffered system incorporated to adjust the pKs and/or maintain it within a certain range will also be effective.

It has also found particularly useful to form the green material on or in contact with one or more fugitive polymer layers or sheets. The processability and handleability of the green body are greatly enhanced through the support provided by such a polymer sheet. The material for the sheet or layer can if desired be selected such that it provides initial support for the green body during subsequent sintering to a product, yet vaporizes without damage to the product in the same manner as the organic binders, dispersants and other organic constituents of the batch are vaporized.

Vaporization of the fugitive polymer sheet or layer can occur before, during, or after other organic components of the green material are vaporized. Fugitive polymers which may be useful to provide such layers or sheets include acrylic polymers and co-polymers and polyalkyl carbonate polymers; optional sheet or layer components include plasticizers and waxes. These are generally though not necessarily free of inorganic powder additives.

Green structures produced as described, whether provided in long continuous lengths or relatively short sheets, are typically sintered by treatment in a high temperature furnace. Long dwell times in the furnace are seldom required due to the low mass of green material present at any one time.

For long continuous lengths of tape or ribbon configuration, the strength of the sintered material is frequently sufficient that the material itself can provide the drawing force needed to continuously draw unsintered green material through the furnace hot zone. As an aid to this process, it is useful to provide supporting setters within the sintering furnace which are angled downwardly in the direction of drawing. This provides a gravitational assist for the transport of the material through the furnace and reduces the draw tension required.

The sintered structure of the invention can be used as a substrate for catalysis. Catalysts of interest for this purpose are the base metal and/or oxide catalysts, such as titanium, vanadium, chromium, cobalt, copper, iron, manganese, molybdenum, nickel, niobium, tantalum, tungsten, zinc, rare earth metals, alloys thereof and therebetween. Additionally, the noble metal catalysts, such as platinum, palladium, silver, rhodium, gold can be combined with the substrate. In combining the catalyst with the substrate, the combination can be by chemical vapor deposition, by coating with a high surface area base coating with a subsequent catalyst overcoat, by impregnating the substrate with the catalyst, or simply mixing the catalyst with the batch prior to sintering.

The present invention can be incorporated as a structural material within other compositions as in a composite. For example, by drawing in narrow elongated form, the sintered material can be made part of another structural material, adding new strength and/or toughness to the material. Both metals and ceramic materials can be used in this manner.

The following examples are illustrative of the various means to practice the invention herein disclosed, and are not intended to limit the scope of the invention.

EXAMPLE 1

To prepare a green ceramic material, 100 grams of yttria-stabilized zirconia powder (commercially available as TZ-2Y powder from the Tosoh Chemical Company of Tokyo, Japan and comprising 2 mole percent $ZrO_2$ as a stabilizer) was milled with a mixture of 30 grams of methanol and 24 grams of 2-methoxy ethanol containing 0.25 grams of a phosphate ester dispersant. The dispersant is commercially available as Emphos PS-21A dispersant from the Witco Chemical Co. of New York, N.Y. This batch was designated as Batch A. Batch B was comprised of 100 grams of the zirconia powder, 16 grams of 2-methoxy ethanol, 20 grams of methanol, and 0.25 grams of Emphos PS-21A dispersant. The batches were milled with ½-inch zirconia balls.

The milled batches were placed in 250 ml wide mouth Nalgene ™ polyethylene bottles and then subsequently placed on a vibratory mill for 76 hours. The particle size distribution in the final batches averaged from about 0.88-1.20 μ, as measured on a Leeds and Northrup Microtrac particle size analyzer. Similar particle size data obtained using a Horiba Capa-500 analyzer from Horiba LTD. of Kyoto, Japan suggest that particle sizes produced by the described milling procedure could be lower than the above reported values by a factor of from 3 to 5, but in any case particle sizes of the order of 0.1-1.2 μm predominate in these batches.

The viscosity of the slip after milling ranged from about 4.2 cps to 11.5 cps at 39.2 $sec^{-1}$, with slips made from oven dried powders showing the lowest values. A viscosity within the range of 3 to 15 is preferred.

Coarse particles were removed from the slip by settling for 3 days, then removing the fluid portion from the settled sludge. An alternative separation procedure is to centrifuge the slip at about 2000 rpm for 10 minutes.

Next added to the slip of Batch A was 2.5 grams of glacial acetic acid, with 2.25 grams of glacial acetic acid being added to Batch B. The addition of the acid helped to develop a flocculated state which is evinced by thixotropy. The degree of thixotropy was dependent upon the amount of acid added.

The slip of Batch A was then mixed with 6 grams of polyvinyl butyral binder, commercially available as Butvar B-98 binder from the Monsanto Company, and 3 grams of dibutyl phthalate. Batch B was mixed with 10 grams of methanol, 8 grams of 2-methoxy ethanol, 6 grams of the binder and 2.9 grams of dibutyl phthalate. The acid was added before the binder, making the binder easier to dissolve. The slips were shaken vigorously for 5 minutes, placed on a roller, and turned slowly for several hours to de-air. Some of the samples of the slip batch were further de-aired in vacuo. The final viscosity of the slips as measured on a Brookfield viscometer was within the range of 1500 to 5000 cps at 8.7 sec$^{-1}$. Batch A, specifically, had a viscosity of 3470 cps in this test.

Tapes were cast from the batches produced as described using a standard 2, 4, or 6 mil doctor blade to cast onto a 2 mil Mylar ® polyester carrier film. In general, the smoothness of the substrate can determine the smoothness of the casting. Thus plastic-coated paper can alternatively be used, but typically provides a surface roughness similar to paper fibers. Smoother substrates including polyester, fluorocarbon, polyethylene and/or polypropylene films are therefore used when a smooth product surface is desired.

The cast tapes thus provided were then allowed to air dry from 5 minutes to several hours, then placed in a drying oven at about 70° C. and/or 90° C. for 5 minutes to an hour. The tape was less brittle and the adhesion to the carrier film lessened after oven drying.

The dried green tape was next released from the carrier film by pulling the film over a sharp edge. Removal of the tape by this or equivalent means prior to cutting of the tape is preferred. The tape was then cut into strips 0.5 to 100 mm in width. The cut tape was then placed on a flat setter plate for sintering, oriented so that the portion of the tape which had contacted the film was facing toward the setter. Alumina and zirconia setters were used.

The tapes were then fired according to the following schedule:
Room temperature to 200° C. in 1 hour
200° C. to 500° C. in 1 hour
500° C. to 1450° C. in 3 hours
1450° C. hold for 2 hours
1450° C. to room temperature in 5 hours The heating rates used were not critical; both faster heat-up and faster cool down rates were successfully tried. However, uniform heating of the tape is preferred to avoid warping during the binder burnout or sintering.

Properties of the tape products thus provided are reported below in Table 1. The table includes a number of samples and their geometrical dimensions produced from Batch A. Once fired the tapes were strong. This was demonstrated by the bend radius achievable for the sintered ribbons. The actual strengths may be calculated from the bending radius attainable without breakage using the bend radius equation, known to those skilled in this art. The accepted elastic modulus of 200 GPa and Poisson's ratio of 0.25 for this zirconia material were used in the equation. The porosity of the sintered tape samples was less than 5 volume percent.

TABLE 1

| Sample | Width ($10^{-3}$ m) | Thickness ($10^{-6}$ m) | Bend Radius ($10^{-3}$ m) | Strength (GPa) |
|---|---|---|---|---|
| 1 | 1.80 | 20 | 1.70 | 1.25 |
| 2 | 1.80 | 18 | 1.78 | 1.07 |
| 3 | 1.80 | 18 | 1.54 | 1.24 |
| 4 | 1.32 | 18 | 1.70 | 1.12 |
| 5 | 1.32 | 18 | 1.71 | 1.11 |
| 6 | 1.02 | 23 | 2.10 | 1.16 |
| 7 | 1.02 | 23 | 2.36 | 1.03 |
| 8 | 0.99 | 20 | 1.83 | 1.16 |

The as-fired surfaces of the tapes which had been in contact with the carrier film were very flat and smooth, providing an excellent surface for coating. The average surface roughness of these as-fired tape surfaces was 8.99 nm for the tape cast on Mylar ® polyester film, as measured by WYKO surface analysis.

EXAMPLE 2

In Example 2, ribbon samples of green material from Batch A were sintered in accordance with a process of continuously firing the green ribbon. Green ceramic ribbons with lengths up to 30 centimeters were fired by drawing the ribbons through a platinum wound furnace heated to 1350° C. The furnace had a small hot zone. The supporting surface for the ribbon within the furnace was set at an incline of between 12 and 20 degrees downwardly from the entrance toward the exit end of the furnace, to provide a gravitational assist for the drawing process.

As the green tape was drawn through the hot zone, the tape sintered to a dense structure that could be easily manipulated. The time in the hot zone was less than 5 minutes, with a rate of sintering of about 2 cm of ribbon length per minute. Higher sintering rates can be achieved by increasing the sintering temperature, e.g., to about 1500° C.

EXAMPLE 3

The use of a fugitive polymer base layer in the tape casting procedures of Examples 1 and 2 is advantageous because it makes the thin green material easier to handle. To provide such a layer, a fugitive polymer solution was prepared in a polyethylene bottle by dissolving 40 parts by weight polymethyl methacrylate (fugitive polymer) in 60 parts of ethyl acetate. The solution was placed on a roller mill to mix.

The acrylic polymer solution thus provided was then cast onto a polyester substrate film using a doctor blade to form thin acrylic sheet. The polymer-coated substrate was then placed in a 60°-70° C. drying oven for 30 to 60 minutes.

A slip containing yttria-stabilized tetragonal zirconia was then prepared utilizing the materials and procedures used to make zirconia Batch A of Example 1. The ceramic slip was then cast over the acrylic layer using a doctor blade. The carrier film with the acrylic and ceramic layers of coating was transferred to a drying oven for 30 to 60 minutes.

The thickness of the fired films was varied as a function of the height of the doctor blades. Thinner or thicker sheets were made by the proper choice of doctor blades and slip viscosity. The lower viscosity slips and smaller blade heights yielded thinner tapes.

The thinnest sheets were produced by thinning a slip such as Batch A of Example 1 with solvents. To 10 grams of the slip were added 1.11 grams of methanol and 0.88 grams of 2-methoxyethanol. Slips with a viscosity of 1500 cps or less may be advantageously made by this technique.

The thinned slip thus provided was cast with a 2 or 3 mil blade on top of a fugitive acrylic layer cast as above described with a 4 mil blade. This produced a composite tape with about a 6 μm green ceramic layer which sintered to around 5 μm. The firing schedule was as reported in Table 2 below:

TABLE 2

| Start Temperature | End Temperature | Time |
|---|---|---|
| Room Temperature | 200 | 120 min |
| 200 | 500 | 360 min |
| 500 | 1420 | 375 min |
| 1420 | 1420 | 120 min |
| 1420 | Room Temperature | 120 min |

Data which were obtained for 1 to 2 mm wide ribbons of sintered ceramic made in accordance with the Example are given below in Table 3:

TABLE 3

| Sample | Thickness ($10^{-6}$ m) | Bend Radius ($10^{-6}$ m) | Strength (GPa) |
|---|---|---|---|
| 9 | 6.0 | 362 | 1.77 |
| 10 | 5.2 | 344 | 1.61 |
| 11 | 11.5 | 710 | 1.72 |
| 12 | 11.5 | 725 | 1.69 |
| 13 | 11.5 | 914 | 1.34 |
| 14 | 11.5 | 850 | 1.44 |
| 15 | 16.0 | 1400 | 1.22 |
| 16 | 16.5 | 1520 | 1.15 |

Samples 9 and 10 above were made from a thinned slip, while the remaining samples were made with the standard Batch A slip. The scatter in the measurements increased for wider samples, such as the 3.5 mm wide sample as shown in Table 4.

TABLE 4

| Sample | Thickness ($10^{-6}$ m) | Bend Radius ($10^{-6}$ m) | Strength (GPa) |
|---|---|---|---|
| 17 | 11.5 | 1020 | 1.20 |
| 18 | 11.5 | 737 | 1.66 |
| 19 | 11.5 | 1180 | 1.04 |

The thicknesses of the 5 to 6 $\mu$m ribbons were determined from optical micrographs. The other thicknesses were measured with a micrometer.

Sintered eight-micron-thick sheets as large as 9.5 cm by 9.5 cm and a four-micron-thick sheet 6 cm by 7 cm have been made with the fugitive polymer. Such sheets were transparent enough to read through. Even thinner sheets can be made by setting the doctor blade for the ceramic slip casting step at zero clearance. Under this condition only the bulk of the ceramic slip causes greater than zero clearance on the blade; thus a residual, very thin, slip layer is provided.

EXAMPLE 4

Small 1.8 mm × 4.8 mm × 8 $\mu$m rectangular pieces of ceramic tape were formed by screen printing an ink consisting of ceramic slip onto a fugitive polymer which had been cast on a Mylar ® casting film. The ink used was prepared by mixing a slip conforming to Batch A of Example 1 with excess binder and enough 2-methoxyethanol to yield a thin consistency. After the printed images were dry, the printed images with fugitive polymer were released from the Mylar ® casting film. The images were then placed polymer side down onto a zirconia setter and sintered to 1420° C. for 2 hours. The sintering schedule shown below in Table 5 was used:

TABLE 5

| Start Temp. (°C.) | Stop Temp. (°C.) | Time (minutes) |
|---|---|---|
| Room Temp. | 150 | 60 |
| 150 | 500 | 420 |
| 500 | 1420 | 375 |
| 1420 | 1420 | 120 |
| 1420 | Room Temp. | 120 |

The ceramic tape samples produced by this process were strong and flexible.

EXAMPLE 5

Ceramic sheet samples approximately 1 cm wide were formed by printing with a rubber stamp onto a fugitive polymer as in Example 4, using the Batch A slip with enough additional t-butyl alcohol solvent to form a printable ink. After sintering using the schedule of Table 5, the resulting ceramic pieces accurately reflected the original image. These pieces retained image details with widths of 140 $\mu$m.

EXAMPLE 6

Narrow tapes of yttria-stabilized $ZrO_2$ were formed from a slip of the composition of Batch A of Example 1 utilizing a combination bead extrusion/doctor blading method. This method was as follows:
a) A doctor blade was brought into contact with a polymer sheet carrier;
b) A narrow continuous bead of slip was placed before the advancing blade and the blade spread the extruded bead to form a narrow tape from the slip;
c) The narrow tape was dried and removed from the carrier film; and,
d) The tape was sintered in the manner described in Example 1 above.

The polymer sheet carrier in this Example was a 2-mil Mylar ® carrier film. The bead was extruded using a 10 cc syringe fitted with a 21 gauge needle. Either 4 mil or 6 mil blades were used to spread the beads into narrow thin tapes. The tapes had a high degree of transparency indicating little porosity.

Results from the bend-testing of the ceramic tapes produced in accordance with the Example are set forth in Table 6 below:

TABLE 6

| Sample | Width ($10^{-3}$ m) | Thickness ($10^{-6}$ m) | Bend Radius ($10^{-3}$ m) | Strength (GPa) |
|---|---|---|---|---|
| 18 | 1 | 25 | 3.0 | 0.89 |
| 19 | 3 | 33 | 3.5 | 1.00 |

Thus high strength in combination with good flexibility in the tape samples were achieved.

To provide cross-sectional configurations other than thin sheet or tape, extrusion processes can be used. Using extrusion, it is possible to provide low aspect ratio ceramic products, even including ceramic fibers. As previously noted, fibers do not exhibit the strength and flexibility of products with high aspect ratio cross-sections or segments. Nevertheless the following example illustrates that fibers can be successfully formed by this technique.

EXAMPLE 7

Ceramic fibers were prepared by extruding a ceramic slip into a gelling liquid. The slip had the composition of Batch A of Example 1, and was used to fill a syringe fitted with a stainless steel 21, 25, and/or 26 gauge needle. The needle end of the syringe was submerged in a gelling liquid, in this case cold water being the preferred agent, and was extruded out through the needle.

The slip gelled upon contact with the water and formed a gelled fiber which reflected the shape of the needle orifice. Details of orifice configuration as fine as 5 microns have been produced. The gelled fiber was draw through 5 to 30 cm of cold water and was then pulled from the water bath and dried by exposure to air.

Green fiber was made by this process at a rate of 2 to 20 cm per second and could be made in very long lengths. Smaller diameter green fiber was produced by using a smaller diameter orifice in combination with lower viscosity slips. The process can be operated in a continuous fashion by wrapping the extruded material on a rotating spool placed approximately one meter above the gelling liquid.

In the process as described, the diameter of the fiber is determined in part by the relative rates at which the material is pushed through the orifice and/or the rate at which it is drawn from the orifice. If material is drawn slowly, a larger diameter is achieved, while if the material is drawn more quickly a thinner diameter is achieved.

The dried fiber samples thus provided were finally fired for 2 hours at 1430° C. to yield sintered fiber from 25 to 150 $\mu$m in diameter.

EXAMPLE 8

Tape 50 $\mu$m thick by 250 $\mu$m wide was produced by extrusion through an approximately rectangular orifice into a gelling liquid as in Example 7. The orifice was prepared by compressing the end of a syringe needle perpendicular to the needle's long axis and then by grinding the needle tip flat. The slip and gelling liquid of Example 7 may be used. Tape as thin as 5 $\mu$m could be made by this method using slip thinned to an appropriate consistency.

Ceramic formulations similar in composition to Batch A of Example 1 but comprising other zirconia powders are also preferred materials for making strong flexible tape, as illustrated in the following Examples.

EXAMPLE 9

A slip was prepared from a ceramic powder using zirconia comprising 4 mole percent $Y_2O_3$ as a stabilizer. The powder was first dried in a vacuum furnace for 90 minutes at 200° C., and then combined into a formulation containing the following ingredients:

| Ceramic powder | 40 g |
| Ethanol | 9.2 g |
| 2-Methoxy ethanol | 6.0 g |
| Methyl isobutyl ketone | 4.0 g |
| Di-butyl phthalate | 3.9 g |
| Emphos PS 21A dispersant | 3.0 g |
| Milling media | 39 g |

The above mixture was milled in a SPEX 8000 Miller/Mixer for 45 minutes. To the resulting mixture was then added 3.0 g of Butvar B-98 binder, with continued milling for an additional 45 minutes.

Tape was cast from the resulting slip onto a plastic coated paper film carrier using a 6-mil doctor blade clearance. The tape was next dried and ribbon was cut from the dried tape using a razor blade. The tape was sintered between zirconia or alumina setter sheets to 1450° C.

A tape 7.3 mm wide, 43 $\mu$m thick and 8 cm long produced as described could be bent to a curvature radius of 8.5 mm, for a calculated strength of 538 MPa. Other structures made from slips of this zirconia powder included sintered ribbon 35 $\mu$m thick by 1 cm wide by 10 cm long, and a 3 cm×3 cm by 75 $\mu$m square zirconia sheet.

EXAMPLE 10

A slip was made containing $ZrO_2$ comprising 6 mole percent $Y_2O_3$. The slip was prepared following the procedure used to make Batch A of Example 1. The mean particle size of the zirconia after milling was 1.1 $\mu$m with 50% of the particles finer than 0.91 $\mu$m.

Tapes were then prepared from the slip following the procedures of Example 1. The properties of the tapes thus provided are reported below in Table 7.

TABLE 7

| Sample | Width ($10^{-3}$ m) | Thickness ($10^{-6}$ m) | Bend Radius ($10^{-3}$ m) | Strength (GPa) |
|---|---|---|---|---|
| 22 | 1.1 | 33 | 8.0 | 439 |
| 23 | 2.5 | 33 | 8.5 | 409 |

The average strength for these samples was 424 MPa, and the tapes exhibited transparency indicative of low porosity.

EXAMPLE 11

A slip was made comprising ceramic powder containing $ZrO_2$ with 2 mole percent $Y_2O_3$ and 2 mole percent $YNbO_4$. The composition of the slip was as follows:

| Ceramic powder | 61 g |
| Methanol | 40 g |
| 2-methoxy ethanol | 32 g |
| Emphos PS21A dispersant | 1.0 g |
| Acetic acid | 1.6 g |
| Milling media | 450 g |

The mix was vibramilled overnight, and an additional 2 g of methanol was added. To 139.8 g of the resulting slip the following binder components were added:

| Poly vinyl butyral | 4.86 g |
| Di-butyl phthalate | 2.43 g |

Tapes were cast from the resulting slip with a 4 mil doctor blade clearance, cut into strips, and the cut samples fired for 2 hours to 1390° C., 1420° C. or 1500° C. Additional tape was made by casting with a 2 mil blade over an acrylic layer which had been cast with a 4 mil blade.

The following properties were obtained:

TABLE 8

| Sample | Firing Temperature (°C.) | Thickness ($10^{-6}$ m) | Bend Radius ($10^{-3}$ m) | Strength (GPa) |
|---|---|---|---|---|
| 24 | 1390 | 10 | 0.26 | * |
| 25 | 1420 | 30 | 2.0 | 1.60 |
| 26 | 1420 | 36 | 3.1 | 1.23 |
| 27 | 1420 | 6 | 1.7 | 0.375** |
| 28 | 1500 | 33 | 3.5 | 1.00 |

*This sample demonstrated porosity and the elastic modulus used in calculating the strength (200 GPa) would tend to overestimate the actual strength.
**These data are for a 2 cm × 2 cm sheet. The remaining data are for 1 to 2 mm wide ribbons.

To account for the bend radius observed in sample 24 above and still have an inherent material strength of order 1.6 GPa, an effective elastic modulus of 80 GPa could be used in the bend radius equation.

In addition to flexibility, the cut sample of the above tape fired at 1500° C. exhibited a high degree of transformation (psuedo-) plasticity, as evidenced by transformation bands both along the fracture surface and at probable areas of stress concentration away from the fracture surface. These transformation bands have been associated with transformation plasticity in materials of this and similar compositions. The present invention thus combines both flexibility and transformation plasticity in one ceramic body.

EXAMPLE 12

A slip was made containing alumina powder with the following ingredients:

| | |
|---|---|
| Alumina | 67 g |
| Methanol | 30 g |
| 2-methoxy ethanol | 24 g |
| Acetic acid | 0.3 g |
| Milling media (zirconia balls) | 450 g |

The alumina powder used was Alcoa A-1000 SG, lot 4BD 6742. The above mixture was vibramilled for 3 days, with the mean particle size after milling being 1.05 μm as measured on a Microtrac analyzer. After milling, the following constituents were added to the slip:

| | |
|---|---|
| Acetic acid | 1.08 g |
| Poly vinyl butyral | 1.30 g |
| Di-butyl phthalate | 0.65 g |

Tape was then cast from this slip, dried, and sintered at 1600° C. for two hours. The sintered tape was sufficiently transparent to serve as a clear overlay through which printed material could easily be read. The following data were obtained from bend tests of the tape, using an elastic modulus of 380 GPa for the sintered alumina:

TABLE 9

| Sample | Width ($10^{-3}$ m) | Thickness ($10^{-6}$ m) | Bend Radius ($10^{-3}$ m) | Strength (GPa) |
|---|---|---|---|---|
| 29 | 1.0 | 38 | 25 | 307 |
| 30 | 1.3 | 36 | 13 | 535 |

EXAMPLE 13

A slip comprising a mixture of alumina and yttria-stabilized zirconia was made from the following ingredients:

| | |
|---|---|
| Batch A zirconia slip | 16.66 g |
| Alumina slip (Example 12) | 4.55 g |
| Acetic acid | 0.19 g |
| Butvar B-98 | 0.22 g |
| Di-butyl phthalate | 0.11 g |

This mixture was milled on a SPEX mill for 10 minutes, and tapes were then cast from the mixture onto Mylar® polymer sheets using 4-mil and 6-mil doctor blade clearances. Strips were cut from the cast tapes and the cut samples fired to about 1430° C. for 2 hours.

The following strengths were calculated from tape bend tests using an elastic modulus value of 230 GPa.

TABLE 10

| Sample | Width ($10^{-3}$ m) | Thickness ($10^{-6}$ m) | Bend Radius ($10^{-3}$ m) | Strength (MPa) |
|---|---|---|---|---|
| 31 | 1.2 | 36 | 4.24 | 1030 |
| 32 | 1.3 | 20 | 2.95 | 829 |
| 33 | 1.3 | 20 | 2.89 | 844 |

Thus high levels of strength and flexibility in the ceramic tape were achieved.

EXAMPLE 14

A slip containing mullite powder was prepared from the following ingredients:

| | |
|---|---|
| Mullite powder | 55 g |
| Methanol | 30 g |
| 2-methoxy ethanol | 24 g |
| Milling media | 450 g |

The mullite powder used was Baikowski 1981 Ref 193 Mullite Powder Deagglomerated Type CR. The mixture was vibramilled for 3 days, after which the mean particle size of the mullite powder was determined to be 1.36 μm as measured on a Microtrac analyzer.

The milled mixture was allowed to settle overnight and the supernatant slip, retaining about 49 weight percent of dispersed mullite, was recovered by decantation. To 25.01 g of this slip were added:

| | |
|---|---|
| Acetic acid | 0.57 g |
| Poly vinyl butyral | 1.37 g |
| Di-butyl phthalate | 0.69 g |

The resulting slip was thoroughly mixed, and tapes were cast and subsequently fired to about 1600° C. for 2 hours. Mullite ribbon 38 microns in thickness prepared from this slip could be bent to a radius of curvature below 3.0 cm without breakage.

EXAMPLE 15

A slip was made containing magnesium aluminate spinel powder with the following ingredients:

| | |
|---|---|
| Spinel | 61 g |
| Methanol | 30 g |
| 2-methoxy ethanol | 24 g |
| Acetic acid | 0.4 g |
| Milling media | 450 g |

The spinel powder used was Baikowski 8293264 log 822 8/82 powder with an alumina content of 72.75%. The mixture of ingredients was vibramilled for 3 days, following which an additional 7.5 g of methanol and 6 g of 2-methoxyethanol were added. The mean particle size after milling was 1.78 μm as measured on a Microtrac analyzer.

To a 20 g portion of the spinel slip thus prepared the following were added:

| | |
|---|---|
| Methanol | 3.00 g |
| 2-methoxy ethanol | 2.40 g |
| Acetic acid | 0.43 g |
| Poly vinyl butyral | 1.04 g |

| -continued | |
|---|---|
| Di-butyl phthalate | 0.52 g |

Tapes were cast from this slip using a 6-mil blade clearance, and the cast tape was then cut into ribbon and fired to 1600° C. The fired ribbon had a thickness of 43 μm and could be bent to a radius of curvature of 2.5 cm without breakage.

EXAMPLE 16

A laminar structure was formed by casting a tape of yttria-stabilized $ZrO_2$ comprising 2 mole percent $Y_2O_3$ over a tape of stabilized $ZrO_2$ comprising 6 mole percent $Y_2O_3$. The 6 mole percent $Y_2O_3$ slip was cast on a Mylar ® carrier film using a 2 mil doctor blade. The tape was allowed to dry for about 5 minutes. Next a slip containing zirconia with 2 mole percent $Y_2O_3$ was cast on top of the first tape using a 6 mil doctor blade. The laminar tape was allowed to dry in an oven at 90° C., released from the carrier film, cut into ribbons and fired at about 1430° C. for 2 hours. It was apparent from a cross-sectional photomicrograph that the sintered laminar ribbons had two distinct layers which exhibited different fracture behavior and scattered light differently. The 6 mole percent $Y_2O_3$ layer of one sintered ribbon was 12 μm thick while the 2 mole percent $Y_2O_3$ layer was 25 μm thick.

Results for bend tests conducted on the laminated samples are reported in Table 11 below. Included in Table 11 for each of the samples tested are the dimensions and properties of the tapes, as well as an indication, by composition, of which surface or side of each tape sample was the side in tension in the bend test.

TABLE 11

| Sample | Side in Tension | Width ($10^{-3}$ m) | Thickness ($10^{-6}$ m) | Bend Radius ($10^{-3}$ m) | Strength (MPa) |
|---|---|---|---|---|---|
| 34 | 6 mol/o | 0.89 | 42 | 9 | 496 |
|  | 2 mol/o | 0.89 | 42 | 6.5 | 687 |
| 35 | 6 mol/o | 0.86 | 41 | 7.25 | 602 |
|  | 2 mol/o | 0.86 | 41 | 6.5 | 671 |
| 36 | 6 mol/o | 1.8 | 43 | 12.5 | 366 |

As the data indicate, the laminar structures of this Example exhibited a strength anisotropy. Hence, strength values obtained with the 6 mole percent $Y_2O_3$ layer in tension (averaging 466 MPa) were generally lower than those obtained with the 2 mole percent $Y_2O_3$ layer in tension (averaging 679 MPa). These values can be compared with the average values obtained for 6 mole percent $Y_2O_3$ ribbons (424 MPa) and for similar 2 mole percent $Y_2O_3$ ribbons (1.11 GPa).

EXAMPLE 17

Flexible ceramic tapes for composite superconducting wires have been produced. In one procedure, a zirconia ribbon substrate was coated with a slip containing $Y_1Ba_2Cu_3O_{7-\delta}$ (where δ equals 0 to 1.0, the compound being referred to as a 123 superconductor). The sintered tape had a thickness of approximately 75 μm and was coated with approximately 30 μm of superconductor-containing slip, and then fired. Firing was for a period of 4 hours at 940° C. to sinter the superconductor and give good adhesion between the coating and the substrate.

X-ray diffraction patterns indicated a high degree of orientation for the coating, with the crystallographic b axis being perpendicular to the plane of the ribbon. The degree of orientation was indicated by the enhanced intensity of the lines with Miller Indices 010, as shown in Table 12 below which reports X-ray line intensities for the 123 superconductor sintered on the $ZrO_2$ tape substrate, and for the bulk 123 powder. The x-ray pattern was indicative of a reasonably good superconducting material, orthorhombic $Y_1Ba_2Cu_3O_{7-\delta}$. Flexibility was also evident after sintering of the coating onto the substrate.

TABLE 12

| | Relative Intensities | | |
|---|---|---|---|
| Miller Index* | 123 on Zirconia | Bulk 123 | Lines with Enhanced Intensity |
| 101 | 5 | — | + |
| 020 | 14 | — | + |
| 001, 030 | 49 | 9 | + |
| 100 | 1 | 2 | |
| 021, 120 | 5 | — | |
| 031 | —# | 28 | |
| 130, 110 | 100 | 100 | |
| 041, 140, 050 | 79 | 14 | + |
| 131 | 12 | 25 | |
| 002, 060 | 92 | 30 | + |
| 200 | 14 | 20 | |
| 151 | 2 | 6 | |
| 161, 132 | 28 | 48 | |
| 231 | 5 | 21 | |

*The indexing scheme used designates the long axis as the b axis.
— Indicates line not discerned by computer program used.
This line appears as a shoulder and was not given an intensity value by the computer program used.

Thick superconductor films of 123 composition tend to react with the zirconia substrate to form a thin layer of barium zirconate at the interface. A sheet of $ZrO_2$ was coated with a slurry containing 123 powder. When this coated zirconia was heated to 950° C. for 20 minutes, the thick film of 123 sintered to itself but did not adhere well to the zirconia. Reaction (or sintering) times of 2 hours at 927° C. were acceptable, improving adherence.

EXAMPLE 18

Fluoride-enhanced thick film superconductor compositions also form superconducting coatings on the flexible ceramic substrates of the invention. Compositions successfully applied include the fluorine-containing materials disclosed in U.S. patent application Ser. No. 07/207,170 filed June 15, 1988 the disclosure of which, as filed, is incorporated herein by reference.

As an illustrative procedure, a slurry containing ethyl acetate and a powdered ceramic superconductor consisting essentially of $Y_1Ba_2Cu_3O_{7-\delta}F$ was prepared by mixing 3 g of powder with 3 g of ethyl acetate. The slurry was pipetted onto a flexible zirconia sheet and the excess slurry allowed to run off. The substrate used was zirconia comprising 4 mole percent of a yttria stabilizer and having a sheet thickness of approximately 70 μm. After firing onto the substrate, the coating demonstrated superconductive behavior; the resistivity of the coating at 77K decreased at least 3 orders of magnitude from the room temperature resistivity. A 50% reduction in resistivity is more typical of conventional conductive materials.

Voltage/current data for the superconducting coating of the Example is set forth in Table 13 below. The Table records the voltages needed to induce current flow over a range of current magnitudes (0.1–10000 mA) for the sample at room temperature (25° C.) and at 77° K.

TABLE 13

| Current (mA) | | | | | | | |
|---|---|---|---|---|---|---|---|
| 0.1 | 1 | 10 | 100 | 1000 | 2000 | 5000 | 10000 |
| Voltages (mV) at 25° C. | | | | | | | |
| 0.000 | 0.006 | 0.047 | 0.462 | 4.625 | — | — | — |
| at 77° K. | | | | | | | |
| 0.000 | 0.000 | 0.000 | 0.000 | 0.000 | 0.011 | 0.194 | 0.943 |

— indicates not measured

EXAMPLE 19

High temperature superconductor coating were applied to flexible zirconia substrates using a laser ablation technique, known to those skilled in this art. Laser ablation targets of two distinct compositions were used, denominated Compositions X and U, the compositions being of the form $Y_1Ba_{2-x}Ag_xCu_3O_{7-\delta}$ wherein the mole proportions of the components were as follows:

| | Composition | |
|---|---|---|
| | X | U |
| | (coefficient in formula) | |
| Y | 1.0 | 1.0 |
| Ba | 2.0 | 1.85 |
| Ag(x) | 0.0 | 0.15 |
| Cu | 3.0 | 3.0 |

These compositions are disclosed in U.S. patent application Ser. No. 07/315,326, filed Feb. 24, 1989, the disclosure of which, as filed, is herein incorporated by reference. These materials were deposited on both flexible ceramic tape and single crystal cubic zirconia using the laser ablation technique. The samples were then annealed according to the following schedule:

TABLE 14

| Starting Set Temperature °C. | Next Set Temperature °C. | Time Minutes |
|---|---|---|
| Room Temperature | 600 | 60 |
| 600 | 600 | 60 |
| 600 | 700 | 15 |
| 700 | 700 | 60 |
| 700 | 850 | 15 |
| 850 | 850 | 360 |
| 850 | Room Temperature | 180 |

Following annealing, silver metal was evaporated onto the coated substrates in order to form electrical contacts for measurements and the coated substrates were heated again in oxygen to 300° C.

Data indicating the electrical resistivities for Compositions X and U on tape and on single crystal cubic zirconia are shown in the Drawing. The Drawing plots the normalized resistance of the samples as a function of temperature over the temperature range from near 0° K. to 100° K., setting unit resistance at the higher temperature. Curve A plots data for Composition U on a flexible $ZrO_2$ substrate, Curve B for Composition U on single crystal $ZrO_2$, Curve C for Composition X on flexible $ZrO_2$, and Curve D for Composition X on single crystal $ZrO_2$. As is clearly demonstrated by the data presented, continuous high temperature superconductor coatings have been provided on these flexible substrates.

EXAMPLE 20

Four narrow (1 mm to 2 mm wide) zirconia ribbons of 20 μm thickness were coated with Composition U of the previous example using laser ablation. The samples were annealed in flowing oxygen using the schedule of the previous example, except that temperatures measured were 661° C. for the 600° C. set, 761° C. for the 700° C. set, and 865° C. for the highest set temperature (for which the set point was 810° C.). Silver electrodes were then laid down on the coatings by vacuum vapor deposition and the samples heated in oxygen to 300° C.

One coated and annealed ribbon from this example was bent to test its strength after heat treatment. The thickness of the substrate was 20 μm, the sample was bent with the coating in compression to a radius of 1.9 mm without breaking. From this data the calculated strength was at least 1.11 GPa. No visible degradation occurred to the coating or the substrate.

EXAMPLE 21

A 0.5 μm coating $Nb_3Sn$ coating was applied to zirconia ribbon substrates by co-sputtering Nb metal and Sn metal using a CVC rf sputtering apparatus. Niobium metal and tin metal were used for targets. The substrates were 25 μm × 1.65 mm × 2.5 cm zirconia ribbons which contained 2 mole % yttria.

The coated ribbons were annealed at 960° C. in vacuum for 1 hour in order to homogenize the alloy. The annealed alloy adhered to the substrates and could be bent to a radius of less than 5 mm in either direction (with the coating in either compression or tension) without either the coating or the substrate suffering visible damage. The x-ray diffraction pattern for a film produced concurrently on an alumina substrate showed a cubic material with lattice parameter of 5.34 angstroms, close to the literature value of 5.291 for $Nb_3Sn$. The film on the flexible zirconia substrate was found to superconduct with a Tc of 18K.

EXAMPLE 22

Flexible zirconia tapes were coated with silver metal by evaporative vapor deposition, followed by heating of the composite to 300° C. The product was a non-ductile, flexible conducting composite. Thus flexible conductors which may be fatigue resistant composites were provided.

EXAMPLE 23

A 1.7 mm wide sintered ribbon of $ZrO_2$ with 2 mole percent $Y_2O_3$ was adhered to a 3 mm thick 4.4 cm OD sintered zirconia ring using a zirconia slip having the composition of Batch A of Example 1. The body so formed was sintered to 1430° C. for 2 hours. After sintering, the ribbon was affixed to the tube.

EXAMPLE 24

Thin green metal tape was prepared by a tape casting process. 167 grams of stainless steel powder was mixed with 42.4 grams of a binder, 10.0 grams of a plasticizer, and 54.5 grams of 1,1,1 trichloroethane. The binder was commercially available 5200 MLC binder made by the E. I. duPont Company and the plasticizer was Santicizer 160 commercially available from the Monsanto Company. These materials were mixed and cast onto Mylar ® polymer film to form a green stainless steel tape layer about 28 mils thick.

To form a covering ceramic layer, 100 grams of $ZrO_2$ powder comprising 2 mole percent of a $Y_2O_3$ stabilizer, 6.48 grams of Butvar B-98 binder, 19.52 grams of ethanol, 31.24 grams of xylene, and 8.24 grams of dibutyl phthalate were mixed into a slurry and applied over the surface of the green stainless steel to provide a green laminar tape configuration. The laminar green tape was then sintered for 2 hours at 1300° C. in a vacuum furnace to provide an strong, flexible integral metal/ceramic composite tape. Composite sintered tapes of less than 30 μm thickness may be made by this process.

EXAMPLE 25

A slip was made with zirconia comprising 2 mole percent $Y_2O_3$ as a stabilizer. The initial batch was prepared in a 250 ml polyethylene bottle and contained 100 g of ceramic powder which had been dried in an oven at 400° C., 24 g of 2-methoxy ethanol, 28 g of methanol, 1.0 g of Emphos PS-21A, and 400 g of $ZrO_2$ milling media. The batch was milled for 70 hours, poured into a 125 ml polyethylene bottle and left to settle for 168 hours. The batch was pipetted off the sediment into another 125 ml bottle and left to settle for an additional 24 hours. The batch was again pipetted off the sediment and into a 125 ml bottle. The twice-settled batch contained approximately 74.9 g of ceramic powder. The mean particle size was 0.38 μm as measured on a Horiba Capa-550. To this slip were added 1.69 g of acetic acid, 2.27 g of dibutyl phthalate, and 4.50 g of polyvinyl butyral. The slip was rolled on a ball mill to dissolve the binder and homogenize the slip. The final viscosity was 598 cps at 8.7 sec-1.

Two fugitive polymer solutions were prepared in 60 ml polyethylene bottles. One solution was prepared by first adding 0.05 g of water to 16 g of medium molecular weight polymethyl methacrylate from Aldrich Chemical Co., Inc. of Milwaukee, Wis., rolling overnight, and warming to 60° C. in an oven. To this was added 32 g of ethyl acetate and 2 g of dibutyl phthalate. Likewise a second fugitive polymer solution was prepared but with 0.05 g of water, 15.6 g of polymer, 29.4 g of ethyl acetate, and 5 g of dibutyl phthalate.

The first fugitive polymer solution was cast on a 2 mil Mylar ® polymer carrier using a doctor blade with a 1 mil clearance. This was dried in an 60° C. oven for several minutes. The slip containing ceramic powder was then cast over the first fugitive polymer layer using a blade with a 1 mil clearance. This was also dried for several minutes in a 60° C. oven. The second fugitive polymer solution was then cast over both of the previous layers, again with a blade with a 1 mil clearance, thus forming a 3-layer sandwich structure.

The cast structure was released from the Mylar ® carrier film, cut to size with a rotary blade and fired to 1450° C. for 2 hours. In this way strong, flexible, refractory 10 cm by 12 cm sheets were prepared which were 8–10 μm thick when measured with a micrometer.

While the invention has been particularly described above with respect to specific materials and specific procedures, it will be recognized that those materials and procedures are presented for purposes of illustration only and are not intended to be limiting. Thus numerous modifications and variations upon the compositions and processes specifically described herein may be resorted to by those skilled in the art within the scope of the appended claims.

We claim:

1. An inorganic sintered structure comprising at least one thin, flexible segment, said segment having a thickness not exceeding about 45 μm, an aspect ratio of segment length to segment thickness of at least about 2:1, and strength and flexibility sufficient to permit segment bending without breakage in at least one direction to an effective radius of curvature of less than 20 centimeters.

2. The structure of claim 1 which is a ceramic structure comprising zirconias, titanias, aluminas, silicas, rare earth metal oxides, alkaline oxides, alkaline earth metal oxides and optional additions of first, second, and third transition series metal oxides and combinations thereof and therebetween.

3. The structure of claim 2 comprising one or more stabilizing agents selected from the group consisting of the oxides of magnesium, calcium, yttrium, titanium, tin, and rare earth metals selected from lanthanum, cerium, praseodynium, neodynium, samarium, europium, gadolinium, terbium, dysprosium, holmium, erbium, thulium, ytterbium, and lutetium.

4. The structure of claim 2 comprising one or more toughening agents selected from the group consisting of niobia, vanadia, tungstia, molbdena, and tantala.

5. The structure of claim 2 comprising one or more alkaline earth metal oxides selected from the group consisting of magnesium, calcium, strontium, and barium.

6. The structure of claim 1 wherein said radius of curvature is less than 5 centimeters.

7. The structure of claim 2 wherein said oxide components are substituted at least in part by components selected from the group consisting borides, nitrides, silicides, carbides and combinations thereof.

8. A structure in accordance with claim 1 having a porosity of up to about 60%.

9. A sintered ceramic structure consisting of a flexible self-supporting ceramic sheet or tape having a thickness not exceeding about 45 μm and sufficient strength and flexibility to permit structural bending without breakage in at least one direction to an effective radius of curvature of less than 5 centimeters.

10. A sintered ceramic structure in accordance with claim 9 which is a flexible ceramic tape having a length of at least about 10 cm.

11. A structure according to claim 9 which consists essentially of zirconia alone or in combination with one or more stabilization agents selected from the group consisting of yttira, calcia, magnesia, rare earth metal oxides, titania, scandia, and tin oxide.

12. A structure according to claim 9 consisting essentially of one or more alumina compositions selected from the group of α-alumina, β-alumina, β''-alumina, $Al_2O_3$—$Cr_2O_3$ solid solution, mullite, and spinel.

13. The structure of claim 3 wherein said thickness does not exceed about 30 μm.

14. The structure of claim 13 wherein said radius of curvature is less than 1 centimeter.

15. A thin flexible sintered structure having a flexibility at least sufficient to permit bending in one or more directions to a radius of curvature of less than 20 centimeters without breakage, the sintered structure comprising a ceramic alloy comprising a zirconia (hafnia) alloy and, optionally, a hard refractory ceramic, the ceramic alloy containing at least 5 volume percent of the zirconia (hafnia) alloy, wherein the zirconia (hafnia) alloy consists essentially of:
  35–99.75 mole % of one or more oxides selected from the group consisting of zirconia, hafnia, and zirconia-hafnia solid solution, and
  0.25–45 mole % of additives selected from the following groups:
    5–45 mole % of titania and/or tin oxide, 0.25-20 mole % total of one or more oxide compounds selected in the indicated proportions from the groups consisting of (i) 0-10 mole % MM'O$_{4+/-\delta}$ wherein M' is selected from the group consisting of V, Nb, and Ta, M is selected from the group consisting of Mg, Ca, Ti, Sn, Sc, Y, La, and the rare earth metals, and $\delta$ is 0-1; (ii) 0-6 mole % M"M'"O$_{4+/-\delta}$ wherein M'" is W and/or Mo, M" is selected from the group consisting of Mg, Ca, Ti, Sn, Sc, Y, La, and rare earth metals, and $\delta$ is 0-1; and (iii) 0-4 mole % MoO$_3$ and/or WO$_3$; and said alloy optionally additionally comprising 0-10 mole % of oxides of one or more metals selected from the group consisting of Mg, Ca, Sc, Y, La, and the rare earth metals, and 0-20 mole % of cerium oxide.

16. The structure of claim 15 wherein the refractory ceramic is selected from the group consisting of $\alpha$-alumina, $\beta$-alumina, $\beta$"-alumina, alumina-chromia solid solutions, chromia, mullite, aluminum mullite-chromium mullite solid solutions, chromium mullite, sialon, nasicon, silicon carbide, silicon nitride, spinels, titanium carbide, titanium nitride, titanium diboride, zircon and/or zirconium carbide.

17. The structure of claim 15 wherein the zirconia (hafnia) alloy consists essentially of:
35-94.75 mole % of oxides selected from the group consisting of zirconia, hafnia, and zirconia-hafnia solid solutions;
5-45 mole % titania and/or tin oxide; and
0.25-20 mole % total of oxides selected in the indicated proportions from the group consisting of 0-20 mole % cerium oxide and 0-10 mole % of oxides of one or more metals selected from the group of Mg, Ca, Sc, Y, La, and/or the rare earth metals.

18. The structure of claim 17 wherein the refractory ceramic consists essentially of one or more compounds selected from the group consisting of $\alpha$-alumina, $\beta$-alumina, $\beta$"-alumina, alumina-chromia solid solutions, chromia, mullite, aluminum mullite-chromium mullite solid solutions, chromium mullite, sialon, nasicon, silicon carbide, silicon nitride, spinels, titanium carbide, titanium nitride, titanium diboride, zircon and/or zirconium carbide.

19. The structure of claim 15 wherein said zirconia (hafnia) alloy consists essentially of:

70-99.5 mole % of one or more oxides selected from the group consisting of zirconia, hafnia, and zirconia-hafnia solid solution;
0.5-10 mole % MM'O$_{4+/-\delta}$ wherein M' is one or more metals selected from the group consisting of V, Nb, and Ta, M is one or more metals selected from the group consisting of Mg, Ca, Ti, Sn, Sc, Y, La, and the rare earth metals, and $\delta$ is 0-1;
0-20 mole % of cerium oxide; and
0-10 mole % of oxides of one or more metals selected from the group consisting of Mg, Ca, Sc, Y, La and the rare earth metals.

20. The structure of claim 19 wherein the refractory ceramic is one or more compounds selected from the group consisting of $\alpha$-alumina, $\beta$-alumina, $\beta$"-alumina, alumina-chromia solid solutions, chromia, mullite, aluminum mullite-chromium mullite solid solutions, chromium mullite, sialon, nasicon, silicon carbide, silicon nitride, spinels, titanium carbide, titanium nitride, titanium diboride, zircon and zirconium carbide.

21. The structure of claim 15 wherein the zirconia (hafnia) alloy consists essentially of:
79-99.75 mole % of oxides selected from the group consisting of zirconia, hafnia, and zirconia-hafnia solid solution;
one or more toughening agents selected in the indicated proportions from the groups consisting of:
0.25-6 mole % M"M'"O$_{4+/-\delta}$ wherein M'" is W and/or Mo, M" is selected from the group consisting of Mg, Ca, Ti, Sn, Sc, Y, La, and the rare earth metals, and $\delta$ is 0-1; and
0.25-4 mole % MoO$_3$ and/or WO$_3$; and, optionally,
0-15 mole % total of one or more constituents selected in the indicated proportions from the following groups:
0-15 mole % CeO$_2$, TiO$_2$, and/or SnO$_2$; and
0-7 mole % of one or more of the oxides of Mg, Ca, Sc, Y, La, and the rare earth metals.

22. The structure of claim 21 wherein the hard refractory ceramic consists essentially of at least one member selected from the group consisting of $\alpha$-alumina, $\beta$-alumina, $\beta$"-alumina, alumina-chromia solid solutions, chromia, mullite, aluminum mullite-chromium mullite solid solutions, chromium mullite, sialon, nasicon, silicon carbide, silicon nitride, spinels, titanium carbide, titanium nitride, titanium diboride, zircon and/or zirconium carbide.

* * * * *